(12) United States Patent
Ikemoto

(10) Patent No.: US 12,119,531 B2
(45) Date of Patent: Oct. 15, 2024

(54) SIGNAL TRANSMISSION LINE COMPRISING STACKED INSULATING LAYERS HAVING A SIGNAL LINE AND A GROUND CONDUCTOR RESPECTIVELY SPACED APART BY A SPACER WITH A HOLLOW PORTION

(71) Applicant: Murata Manufacturing Co., Ltd., Nagaokakyo (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 323 days.

(21) Appl. No.: 17/691,495

(22) Filed: Mar. 10, 2022

(65) Prior Publication Data

US 2022/0200116 A1 Jun. 23, 2022

Related U.S. Application Data

(63) Continuation of application No. PCT/JP2020/041294, filed on Nov. 5, 2020.

(30) Foreign Application Priority Data

Nov. 15, 2019 (JP) .................. 2019-206612

(51) Int. Cl.
*H01P 3/08* (2006.01)
*H05K 1/02* (2006.01)
(52) U.S. Cl.
CPC ............. *H01P 3/082* (2013.01); *H01P 3/08* (2013.01); *H01P 3/088* (2013.01); *H05K 1/0237* (2013.01)
(58) Field of Classification Search
CPC ................. H01P 3/082; H01P 3/088
(Continued)

(56) References Cited

U.S. PATENT DOCUMENTS

2005/0083147 A1\* 4/2005 Barr .................. H01P 3/088
333/33
2008/0061900 A1\* 3/2008 Park et al. ................ H01P 3/08
333/1

(Continued)

FOREIGN PATENT DOCUMENTS

| JP | 2017-108455 A | 6/2017 |
| WO | 2017/130731 A1 | 8/2017 |
| WO | 2018/151134 A1 | 8/2018 |

OTHER PUBLICATIONS

Official Communication issued in International Patent Application No. PCT/JP2020/041294, mailed on Feb. 2, 2021.

*Primary Examiner* — Benny T Lee
(74) *Attorney, Agent, or Firm* — Keating & Bennett, LLP

(57) ABSTRACT

A transmission line includes a first structure including a first insulating substrate and a ground conductor on the first insulating substrate, a second structure including a second insulating substrate and a signal line, ground conductors, and interlayer connection conductors on or in the second insulating substrate, a third insulating substrate including openings, and metal bonding materials that bond the structure and the structure to each other with the third insulating substrate interposed therebetween. The first and second insulating substrates are stacked with the third insulating substrate interposed therebetween to define hollow portions. The signal line and the ground conductor partially face each other across the hollow portions in a bonding direction. The ground conductor includes openings in regions that overlap the signal line but do not overlap the hollow portions when looking in plan view in the bonding direction.

19 Claims, 12 Drawing Sheets

(58) Field of Classification Search
USPC .......................................................... 333/238
See application file for complete search history.

(56) References Cited

U.S. PATENT DOCUMENTS

| | | | |
|---|---|---|---|
| 2014/0028413 A1* | 1/2014 | Ishii et al. | G01R 1/067 |
| | | | 333/33 |
| 2017/0187087 A1 | 6/2017 | Baba et al. | |
| 2018/0309182 A1 | 10/2018 | Iida et al. | |
| 2019/0297722 A1 | 9/2019 | Baba et al. | |

* cited by examiner

SIGNAL TRANSMISSION LINE COMPRISING STACKED INSULATING LAYERS HAVING A SIGNAL LINE AND A GROUND CONDUCTOR RESPECTIVELY SPACED APART BY A SPACER WITH A HOLLOW PORTION

CROSS REFERENCE TO RELATED APPLICATIONS

This application claims the benefit of priority to Japanese Patent Application No. 2019-206612 filed on Nov. 15, 2019 and is a Continuation Application of PCT Application No. PCT/JP2020/041294 filed on Nov. 5, 2020. The entire contents of each application are hereby incorporated herein by reference.

BACKGROUND OF THE INVENTION

1. Field of the Invention

The present invention relates to a transmission line along which radio-frequency signals are able to be transmitted and to an electronic device including the transmission line.

2. Description of the Related Art

A signal transmission line disclosed in International Publication No. 2017/130731 is an example of a transmission line of the related art. The signal transmission line includes a multilayer body having a hollow part and a signal conductor formed inside the multilayer body. The signal conductor is disposed so as to be exposed in the hollow part. The signal transmission line has a section having a hollow part and a section not having a hollow part in the extension direction thereof. The signal transmission line is mounted in a bent state on a circuit board having a step portion. At this time, the signal transmission line is bent at the section not having a hollow part. Therefore, deformation of the hollow part is suppressed and changes in the characteristic impedance of the signal transmission line are reduced.

SUMMARY OF THE INVENTION

In the signal transmission line disclosed in International Publication No. 2017/130731, there is a large change in characteristic impedance at the boundary between the section having a hollow part and the section not having a hollow part, and therefore transmission loss in the signal transmission line is large.

Preferred embodiments of the present invention provide transmission lines that each achieve reduced transmission loss despite including a hollow structure, and also provide electronic devices each including such a transmission line.

A transmission line according to a preferred embodiment of the present invention includes a first structure including a first insulating substrate and a first ground conductor on or in the first insulating substrate; a second structure including a second insulating substrate and a signal line, a second ground conductor, and an interlayer connection conductor on or in the second insulating substrate; a spacer including a third insulating substrate including an opening; and a metal bonding material that bonds the first structure and the second structure to each other with the spacer interposed therebetween. The first insulating substrate and the second insulating substrate are stacked with the third insulating substrate interposed therebetween to define a hollow portion. The signal line and the first ground conductor partially face each other across the hollow portion in a bonding direction. The first ground conductor includes an opening in a region that overlaps the signal line but does not overlap the hollow portion when looking in plan view in the bonding direction.

An electronic device according to a preferred embodiment of the present invention includes a circuit board and the transmission line according to another preferred embodiment of the present invention connected to the circuit board.

According to preferred embodiments of the present invention, transmission losses of transmission lines each including a hollow structure are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, a plurality of preferred embodiments of the present invention will be described, where like features are denoted by the same reference labels throughout the detailed description of the drawings. Each preferred embodiment is an illustrative example and portions of the configurations described in different preferred embodiments can be substituted for one another or combined with one another. In each preferred embodiment, points that are different from those described prior to that preferred embodiment are described. In particular, the same operational effects resulting from the same configurations are not repeatedly described in the individual preferred embodiments.

First Preferred Embodiment

Figure 1:
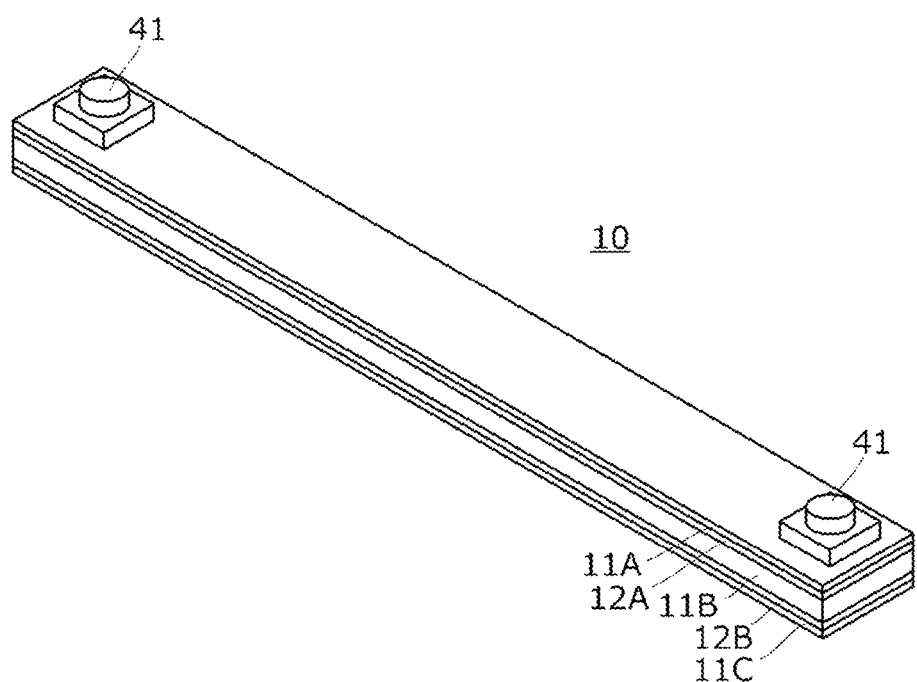
FIG. 1 is an external perspective view of a transmission line according to a First Preferred Embodiment of the present invention.
Figure 2:
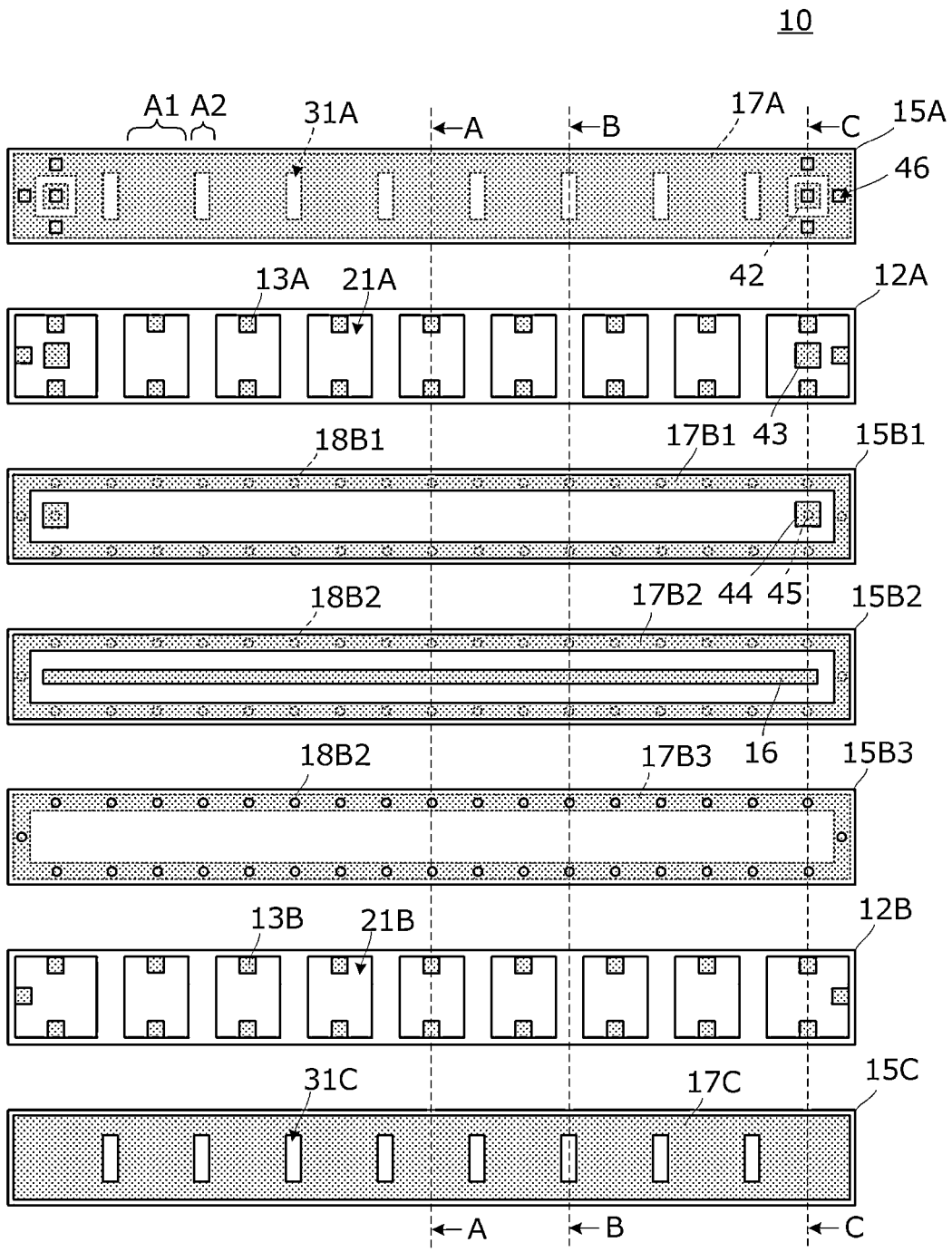
FIG. 2 is a plan view of layers of the transmission line.
Figure 3A:
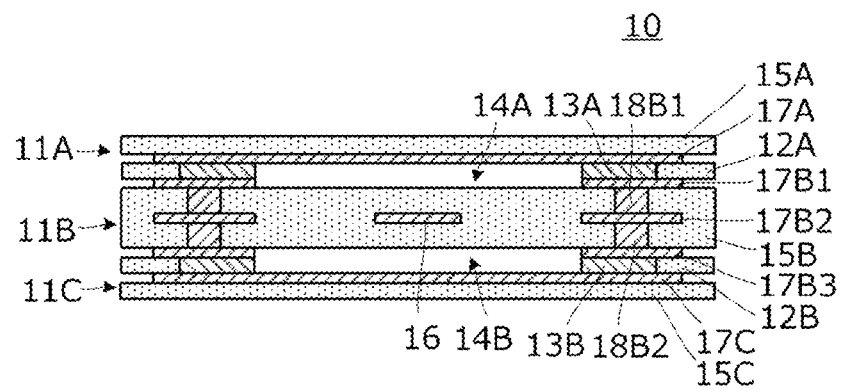
FIG. 3A is an A-A sectional view (FIG. 2) of the transmission line.
Figure 3B:
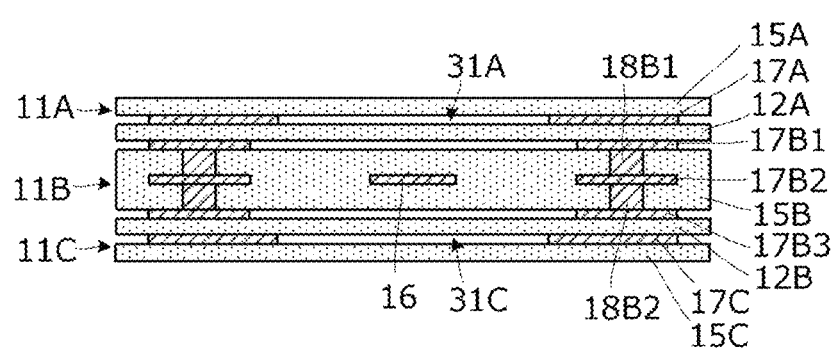
FIG. 3B is a B-B sectional view (FIG. 2) of the transmission line.
Figure 3C:
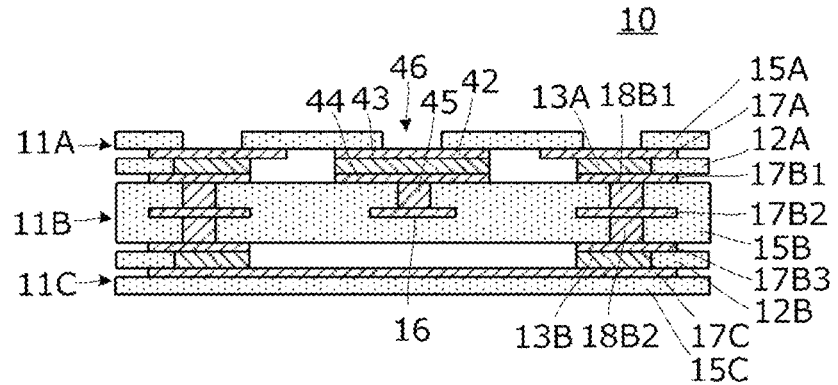
FIG. 3C is a C-C sectional view (FIG. 2) of the transmission line.

FIG. 1 is an external perspective view of a transmission line 10 according to a First Preferred Embodiment of the present invention. FIG. 2 is a plan view of layers of the transmission line 10. FIG. 3A is an A-A sectional view (FIG. 2) of the transmission line 10. FIG. 3B is a B-B sectional view (FIG. 2) of the transmission line 10. FIG. 3C is a C-C sectional view (FIG. 2) of the transmission line 10.

For example, the transmission line 10 is connected to a circuit board and forms a portion of an electronic device together with the circuit board.

As illustrated in FIG. 1, the transmission line 10 includes structures 11A, 11B, and 11C, insulating substrates 12A and 12B, and connectors 41. The structures 11A and 11C are examples of a "first structure". The structure 11B is an example of a "second structure". The insulating substrates 12A and 12B are examples of a "third insulating substrate". The insulating substrates 12A and 12B define spacers. The structures 11A, 11B, and 11C and the insulating substrates 12A and 12B have planar shapes and extend in one direction. The structure 11A, the insulating substrate 12A, the structure 11B, the insulating substrate 12B, and the structure 11C are stacked in order from the upper side to the lower side with their length directions aligned. The connectors 41 are provided on the upper surface of the structure 11A at both ends in the length direction of the structure 11A.

In the present specification, the terms "upper surface" and "lower surface" are used for convenience to distinguish between the main surface on one side and the main surface on the other side. Similarly, the terms "upper side" and "lower side" are used for convenience in order to distinguish between one side and the other side.

As illustrated in FIG. 2, FIGS. 3A and 3B, the structure 11A and the structure 11B are bonded to each other by metal bonding materials 13A with the insulating substrate 12A defining a spacer interposed therebetween. The structure 11B and the structure 11C are bonded to each other by metal bonding materials 13B with the insulating substrate 12B defining a spacer interposed therebetween.

The structure 11A includes an insulating substrate 15A and a ground conductor 17A. The structure 11B includes an insulating substrate 15B, a signal line 16, ground conductors 17B1, 17B2, and 17B3, and interlayer connection conductors 18B1 and 18B2. The structure 11C includes an insulating substrate 15C and a ground conductor 17C. The insulating substrates 15A and 15C are examples of a "first insulating substrate". The ground conductors 17A and 17C are examples of a "first ground conductor". The insulating substrate 15B is an example of a "second insulating substrate". The ground conductors 17B1, 17B2, and 17B3 are examples of a "second ground conductor". A plurality of openings 21A are located in the insulating substrate 12A. A plurality of openings 21B are located in the insulating substrate 12B.

The insulating substrate 15A and the insulating substrate 15B are stacked with the insulating substrate 12A interposed therebetween, and as a result, hollow portions 14A are provided. The signal line 16 and the ground conductor 17A partially face each other across the hollow portions 14A in the bonding direction (direction in which the structures 11A, 11B, and 11C are bonded to each other). Openings 31A in the ground conductor 17A are located in regions overlapping the signal line 16 but not overlapping the hollow portions 14A in plan view in the bonding direction. Similarly, the insulating substrate 15B and the insulating substrate 15C are stacked with the insulating substrate 12B interposed therebetween, and as a result, hollow portions 14B are provided. The signal line 16 and the ground conductor 17C partially face each other across the hollow portions 14B in the bonding direction. The ground conductor 17C includes a plurality of openings 31C in regions overlapping the signal line 16 but not overlapping the hollow portions 14B in plan view in the bonding direction.

The hollow portions 14A are disposed at regular intervals along the length direction of the transmission line 10. In other words, the hollow portions 14A are periodically disposed along the extension direction of the signal line 16. The openings 31A in the ground conductor 17A are disposed at regular intervals along the length direction of the transmission line 10. In other words, the openings 31A in the ground conductor 17A are periodically disposed along the extension direction of the signal line 16. The openings 31A in the ground conductor 17A are disposed between adjacent hollow portions 14A along the length direction of the transmission line 10. The hollow portions 14B and the openings 31C in the ground conductor 17C are configured in a similar manner.

The transmission line 10 includes a plurality of regions A1 in which the hollow portions 14A and 14B are provided and a plurality of regions A2 in which hollow portions are not provided. The regions A1 and the regions A2 are disposed in an alternating manner along the length direction of the transmission line 10. The openings 31A in the ground conductor 17A and the openings 31C in the ground conductor 17C are disposed in the regions A2.

The dimensions of the openings 31A and 31C in the length direction of the transmission line 10 may be somewhat smaller than the intervals between adjacent hollow portions 14A, as illustrated in FIG. 2, or may be equal to or somewhat larger than the intervals between the adjacent hollow portions 14A.

The insulating substrates 12A, 12B, 15A, 15B, and 15C have flexibility and include a liquid crystal polymer (LCP) as a main component, for example. The insulating substrate 15B includes insulating layers 15B1, 15B2, and 15B3, which are integrated with each other. The insulating layers 15B1, 15B2, and 15B3 are disposed in order from the upper side to the lower side. The plurality of openings 21A in the insulating substrate 12A each have a rectangular or substantially rectangular shape and are disposed at regular or substantially regular intervals along the length direction of the insulating substrate 12A. The plurality of openings 21B in the insulating substrate 12B each have a rectangular or substantially rectangular shape and are disposed at regular or substantially regular intervals along the length direction of the insulating substrate 12B.

The insulating substrate 15A of the structure 11A and the insulating substrate 15C of the structure 11C may include a plurality of insulating layers similarly to the insulating substrate 15B of the structure 11B.

The insulating substrates 12A, 12B, 15A, 15B, and 15C are preferably made of the same type of material. This enables the structures 11A, 11B, and 11C and the insulating substrates 12A and 12B to be integrated with each other in a state where strain caused by differences in physical properties between the insulating substrates 12A, 12B, 15A, 15B, and 15C is unlikely to occur.

The insulating substrates 12A, 12B, 15A, 15B, and 15C may be made of materials having different properties. For example, the insulating substrates 15A and 15C, which are disposed on the outside of the transmission line 10, may be made of materials having excellent weather resistance (environmental resistance) or mechanical properties. Weather resistance is a property of being resistant to deformation, alteration, deterioration, and so on with respect to changes in temperature, humidity, and other factors. Mechanical properties include strength, such as bending strength, and hardness and toughness. The insulating substrate 15B, which is disposed inside the transmission line 10, may be made of a material in which the electrical characteristics are prioritized. For example, if the insulating substrate 15B is made of a material having a low relative dielectric constant, the line width of the signal line 16 can be increased when setting the characteristic impedance of the transmission line 10 to a desired value, and therefore conductor loss occurring in the signal line 16 can be reduced. Alternatively, the insulating substrates 12A, 12B, 15A, 15B, and 15C may be made of materials of different colors/shades. This would make it easy to identify the substrates by performing image recognition in the process of manufacturing the transmission line 10.

The ground conductor 17A extends over substantially the entire lower surface of the insulating substrate 15A. The signal line 16, the ground conductors 17B1, 17B2, and 17B3, and the interlayer connection conductors 18B1 and 18B2 are located on and in the insulating substrate 15B. The ground conductor 17B1 is located on the upper surface of the insulating layer 15B1. The signal line 16 and the ground conductor 17B2 is disposed on the upper surface of the insulating layer 15B2. The ground conductor 17B3 is disposed on the lower surface of the insulating layer 15B3. The signal line 16 extends in the length direction of the structure 11B at the center in the width direction of the structure 11B. The ground conductors 17B1, 17B2, and 17B3 extend in the length direction of the structure 11B along both edges in the width direction of the structure 11B. The ground conductor 17C extends over substantially the entire upper surface of the insulating substrate 15C. The signal line 16 and the ground conductors 17A, 17B1, 17B2, 17B3, and 17C are conductor patterns made of Cu foil, for example.

A plurality of signal lines 16 may be provided. In this case, the ground conductors and the interlayer connection conductors may be between the plurality of signal lines 16 in order to secure isolation between the plurality of signal lines 16.

The signal line 16 and the ground conductor 17A face each other with the hollow portions 14A and the insulating substrate 15B interposed therebetween. The signal line 16 and the ground conductor 17C face each other with the hollow portions 14B and the insulating substrate 15B interposed therebetween. This prevents short circuits between the signal line 16 and the ground conductors 17A and 17C caused by deformation of the hollow portions 14A and 14B.

The signal line 16 and the ground conductor 17A may face each other across at least any of the hollow portions 14A and the insulating substrates 15A and 15B by changing the arrangements of the signal line 16, the ground conductor 17A, and so on as appropriate. Similarly, the signal line 16 and the ground conductor 17C may face each other across at least any of the hollow portions 14B and the insulating substrates 15B and 15C.

The openings 31A in the ground conductor 17A have rectangular or substantially rectangular shapes and extend in the width direction of the structure 11A. The openings 31C in the ground conductor 17C have rectangular or substantially rectangular shapes and extend in the width direction of the structure 11C. The openings 31A in the ground conductor 17A and the openings 31C in the ground conductor 17C are disposed at the same positions in plan view in the bonding direction.

The ground conductor 17B1 is bonded to and electrically connected to the ground conductor 17B2 via the interlayer connection conductors 18B1. The ground conductor 17B2 is bonded to and electrically connected to the ground conductor 17B3 via the interlayer connection conductors 18B2. The interlayer connection conductors 18B1 and 18B2 are made of a Cu—Sn alloy, for example.

A plurality of the metal bonding materials 13A and 13B are disposed with intervals therebetween along the length direction of the transmission line 10 along both edges in the width direction of the transmission line 10. The metal bonding materials 13A are disposed in the openings 21A in the insulating substrate 12A and bond and electrically connect the ground conductor 17A and the ground conductor 17B1 to each other. Thus, the metal bonding materials 13A bond the structure 11A and the structure 11B to each other with the insulating substrate 12A defining a spacer interposed therebetween. Similarly, the metal bonding materials 13B are disposed in the openings 21B in the insulating substrate 12B and bond and electrically connect the ground conductor 17B3 and the ground conductor 17C to each other. Thus, the metal bonding materials 13B bond the structure 11B and the structure 11C to each other with the insulating substrate 12B defining a spacer interposed therebetween. The metal bonding materials 13A and 13B are made of solder, for example.

The metal bonding materials 13A and 13B may have square or substantially square shapes in plan view in the bonding direction as illustrated in FIG. 2 or may be shaped so as to be somewhat longer in the extension direction of the signal line 16. In the case where the metal bonding materials 13A and 13B are relatively shorter in the extension direction of the signal line 16, the transmission line 10 has better flexibility. In the case where the metal bonding materials 13A and 13B are relatively longer in the extension direction of the signal line 16, a bent shape of the transmission line 10 is more readily maintained by plastic deformation of the metal bonding materials 13A and 13B.

The hollow portions 14A are surrounded by the lower surface of the ground conductor 17A, the upper surface of the insulating substrate 15B, and the end surfaces of the openings 21A in the insulating substrate 12A. The hollow portions 14B are surrounded by the lower surface of the insulating substrate 15B, the upper surface of the ground conductor 17C, and the end surfaces of the openings 21B in the insulating substrate 12B. The hollow portions 14A and the hollow portions 14B are disposed at the same positions in plan view in the bonding direction.

Electrically conductive protective films such as Ni/Au films, which have excellent resistance to oxidation, may be formed using, for example, a plating treatment on surfaces of the ground conductors 17A, 17B1, 17B3, and 17C exposed to the hollow portions 14A and 14B or to the space outside the transmission line 10.

As illustrated in FIG. 2 and FIG. 3C, mounting electrodes are provided on the lower surface side of the insulating substrate 15A at both ends in the length direction of the insulating substrate 15A. The mounting electrodes 42 are connected to the end portions of the signal line 16 via metal bonding materials 43, inner electrodes 44, and interlayer connection conductors 45. Openings 46 are provided in the insulating substrate 15A at both ends in the length direction of the insulating substrate 15A so that parts of the ground conductor 17A are exposed and the mounting electrodes 42 are exposed. The connectors 41 (refer to FIG. 1) are electrically connected to the ground conductor 17A and the mounting electrodes 42, which are exposed through the openings 46.

In the First Preferred Embodiment, the hollow portions 14A and 14B are located in the regions A1 of the transmission line 10 and no hollow portions are located in the regions A2 of the transmission line 10. Therefore, the relative dielectric constant between the layer where the signal line 16 is disposed and the layers where the ground conductors 17A and 17C are disposed is higher in the regions A2 than in the regions A1. However, the openings 31A and 31C are provided in the ground conductors 17A and 17C in the regions A2. Therefore, the areas where the signal line and the ground conductors 17A and 17C face each other are smaller in the regions A2 than in the regions A1. Therefore, changes in the characteristic impedance at the boundaries between the regions A1 and the regions A2 are reduced, and as a result, transmission loss in the transmission line 10 is reduced.

FIGS. 4A to 4F are sectional views illustrating a non-limiting example of a method of manufacturing the transmission line 10.

Figure 4A:
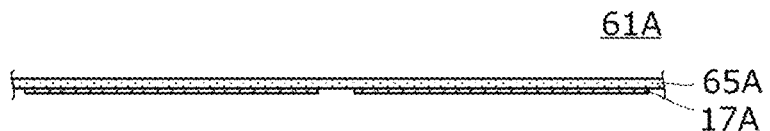
FIGS. 4A to 4F are sectional views illustrating a method of manufacturing the transmission line.

First, as illustrated in FIG. 4A, the ground conductor 17A and the mounting electrodes 42 (refer to FIG. 2) are formed by patterning a metal foil attached to an insulating substrate 65A by using photolithography or the like. In addition, the openings 46 (refer to FIG. 2) are formed in the insulating substrate 65A using a laser or the like. Thus, a structure 61A including a plurality of structures 11A are formed.

Figure 4B:
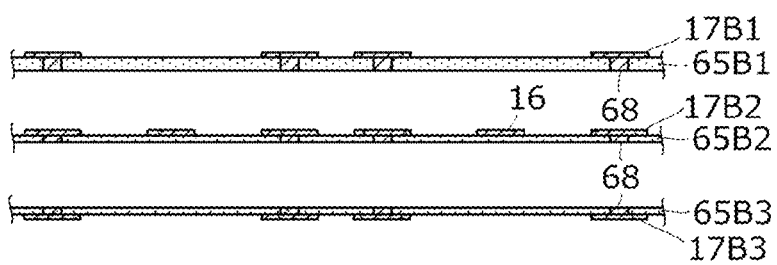

Furthermore, as illustrated in FIG. 4B, the signal line 16, the ground conductors 17B1, 17B2, and 17B3, and the inner electrodes 44 (refer to FIG. 2) are formed by patterning metal foils attached to insulating substrates 65B1, 65B2, and 65B3 using photolithography or the like. In addition, through holes are formed in the insulating substrates 65B1, 65B2, and 65B3 using a laser or the like and the through holes are then filled with an electrically conductive paste 68.

Figure 4C:
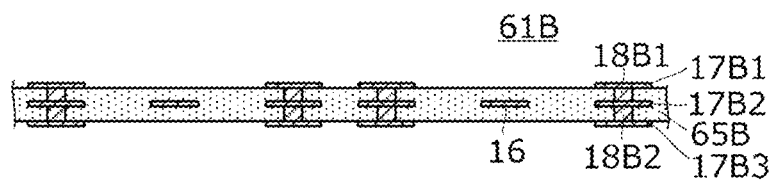

Next, as illustrated in FIG. 4C, the insulating substrates 65B1, 65B2, and 65B3 are stacked and subjected to heat pressing. Thus, the insulating substrates 65B1, 65B2, and 65B3 are integrated so as to define an insulating substrate 65B and the interlayer connection conductors 18B1 and 18B2 and the interlayer connection conductors 45 (refer to FIG. 2) are formed by curing the electrically conductive paste 68. In this way, a structure 61B including a plurality of structures 11B is formed.

Figure 4D:
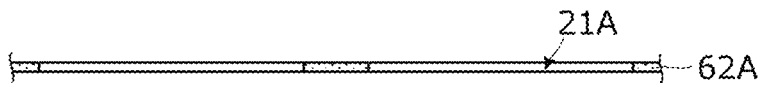

Furthermore, as illustrated in FIG. 4D, the openings 21A are formed in an insulating substrate 62A using punching or another process.

Figure 4E:
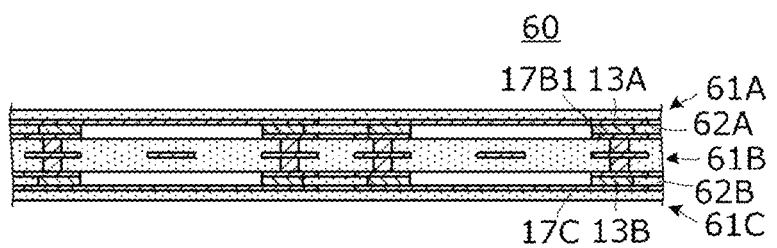

Next, as illustrated in FIG. 4E, for example, after applying solder paste via printing to the surfaces of the ground conductors 17B1 and 17C, the structures 61A, 61B, and 61C and the insulating substrates 62A and 62B are stacked and heat pressed with the structures 61A, 61B, and 61C and the insulating substrates 62A and 62B in an extended state. Thus, a collective board 60 including a plurality of transmission lines 10 is formed. Here, the structure 61C is formed preferably using the same processes as the structure 61A in advance and includes a plurality of structures 11B, for example. The insulating substrate 62B is formed using the same processes as the insulating substrate 62A in advance and includes the openings 21B.

In the above-described processes, the structures 61A, 61B, and 61C and the insulating substrates 62A and 62B are kept in an extended state (i.e., an unbent state), and as a result, formation of the hollow portions 14A and 14B can be ensured and variations in the heights of the hollow portions 14A and 14B can be reduced.

Figure 4F:
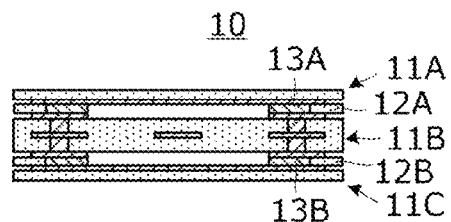

Finally, as illustrated in FIG. 4F, the collective board 60 is divided into individual pieces and as a result, individual transmission lines 10 are obtained.

Second Preferred Embodiment

In a Second Preferred Embodiment, an auxiliary ground conductor is provided on a surface layer side of the transmission line so as to cover openings in a ground conductor.

Figure 5A:
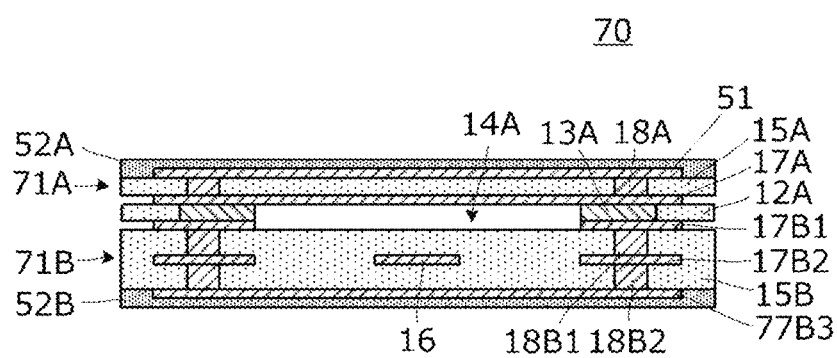
FIGS. 5A and 5B are sectional views of a transmission line according to a Second Preferred Embodiment of the present invention.
Figure 5B:
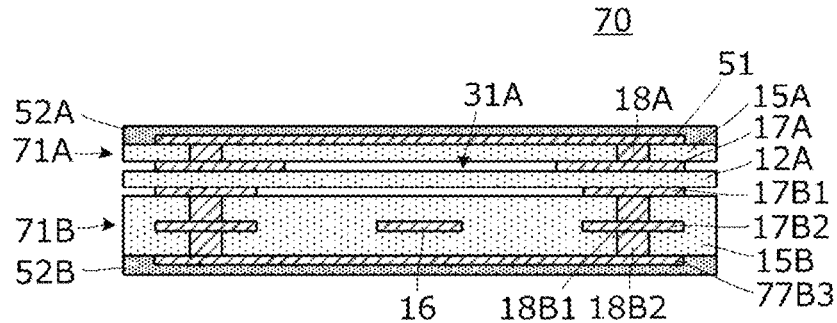

FIGS. 5A and 5B are sectional views of a transmission line 70 according to a Second Preferred Embodiment of the present invention. FIGS. 5A and 5B respectively correspond to the A-A sectional view and the B-B sectional view of the transmission line 10 according to the First Preferred Embodiment (refer to FIGS. 3A and 3B). The transmission line 70 includes structures 71A and 71B, an insulating substrate 12A, metal bonding materials 13A, and protective layers 52A and 52B. The structure 71A and the structure 71B are bonded to each other by the metal bonding materials 13A with the insulating substrate 12A interposed therebetween similarly to as in the First Preferred Embodiment.

The structure 71A differs from the structure 11A according to the First Preferred Embodiment (refer to FIGS. 3A and 3B) in that the structure 71A includes an auxiliary ground conductor 51 and interlayer connection conductors 18A. The auxiliary ground conductor 51 is provided over substantially the entire upper surface of the insulating substrate 15A except for at mounting electrode portions (at both end portions of the transmission line 70 in the length direction). The auxiliary ground conductor 51 does not have any openings. In other words, the auxiliary ground conductor 51 is provided so as to cover the openings 31A in the ground conductor 17A on the surface layer side of the transmission line 70. The ground conductor 17A and the auxiliary ground conductor 51 are bonded and electrically connected to each other by the interlayer connection conductors 18A.

The structure 71B differs from the structure 11B according to the First Preferred Embodiment (refer to FIGS. 3A and 3B) as follows. The structure 71B includes a ground conductor 77B3 instead of the ground conductor 17B3. The ground conductor 77B3 extends over substantially the entire lower surface of the insulating substrate 15B. The ground conductor 77B3 does not have any openings.

The protective layer 52A is provided on the upper surface of the insulating substrate 15A so as to cover the auxiliary ground conductor 51. The protective layer 52B is provided on the lower surface of the insulating substrate 15B so as to cover the ground conductor 77B3.

In the Second Preferred Embodiment, the auxiliary ground conductor 51 defines and functions as an electromagnetic shield, and therefore unwanted radiation radiated to the outside from the openings 31A in the ground conductor 17A is reduced or prevented.

Third Preferred Embodiment

In a Third Preferred Embodiment, the thickness of the insulating substrate where the signal line is located is reduced at positions where the signal line faces the ground conductor so as to reduce the ratio of resin portions located between the signal line and the ground conductor in the bonding direction.

Figure 6A:
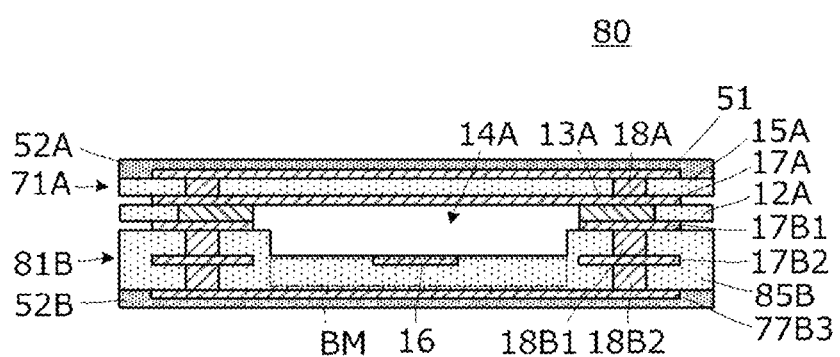
FIGS. 6A and 6B are sectional views of a transmission line according to a Third Preferred Embodiment of the present invention.
Figure 6B:
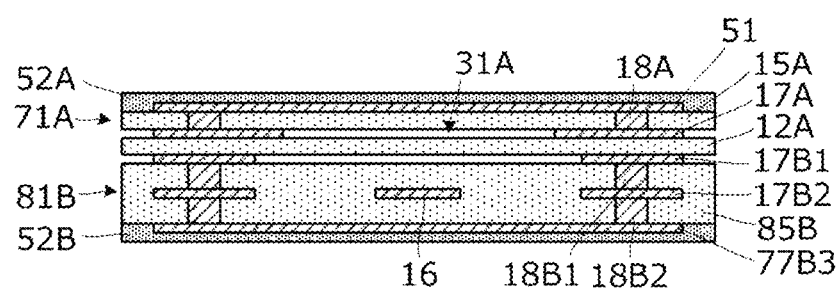

FIGS. 6A and 6B are sectional views of a transmission line 80 according to the Third Preferred Embodiment of the present invention. FIGS. 6A and 6B respectively correspond to the A-A sectional view and the B-B sectional view of the transmission line 10 according to the First Preferred Embodiment (refer to FIGS. 3A and 3B). The transmission line 80 differs from the transmission line 70 according to the Second Preferred Embodiment (refer to FIGS. 5A and 5B) as follows. The transmission line 80 includes a structure 81B including an insulating substrate 85B instead of the structure 71B including the insulating substrate 15B.

The insulating substrate 85B includes a plurality of portions BM at positions where the signal line 16 faces the ground conductor 17A. The portions BM of the insulating substrate 85B are located at the same positions as the hollow portions 14A in plan view in the bonding direction. The portions BM of the insulating substrate 85B are thinner than the portions of the insulating substrate 85B that do not face the hollow portions 14A. The portions BM of the insulating substrate 85B are thinner as a result of recesses being formed in the upper surface of the insulating substrate 85B. In other words, the transmission line includes portions where the thickness of the insulating substrate 85B is reduced at positions where the signal line 16 faces the ground conductor 17A so as to reduce the ratio of resin portions located between the signal line 16 and the ground conductor 17A in the bonding direction.

The signal line 16 is exposed inside the hollow portions 14A as a result of the portions BM of the insulating substrate 85B being made thinner. The portions BM of the insulating substrate 85B are disposed at regular or substantially regular intervals along the length direction of the structure 81B. The dimension of the portions BM of the insulating substrate 85B may be somewhat larger than the width of the signal line 16, may be identical to the width of the signal line 16, or somewhat smaller than the width of the signal line 16 in the lateral direction of the structure 81B.

The portions BM of the insulating substrate 85B may be formed by cutting away (hollowing out) the insulating substrate using plasma processing or the like. Alternatively, the portions BM of the insulating substrate 85B may be formed by stacking a plurality of insulating substrates in portions of which openings are formed.

In the Third Preferred Embodiment, the thickness of the insulating substrate 85B is reduced at positions where the signal line 16 faces the ground conductor 17A so as to reduce the ratio of resin portions located between the signal line 16 and the ground conductor 17A in the bonding direction. As a result, the relative dielectric constant between the layer where the signal line 16 is disposed and the layer where the ground conductor 17A is disposed is reduced. Therefore, the line width of the signal line 16 can be increased when setting the characteristic impedance of the transmission line 80 to a desired value, and therefore conductor loss occurring in the signal line 16 can be reduced.

Fourth Preferred Embodiment

In a Fourth Preferred Embodiment, hollow portions and openings in ground conductors extend diagonally with respect to the extension direction of the signal line.

Figure 7:
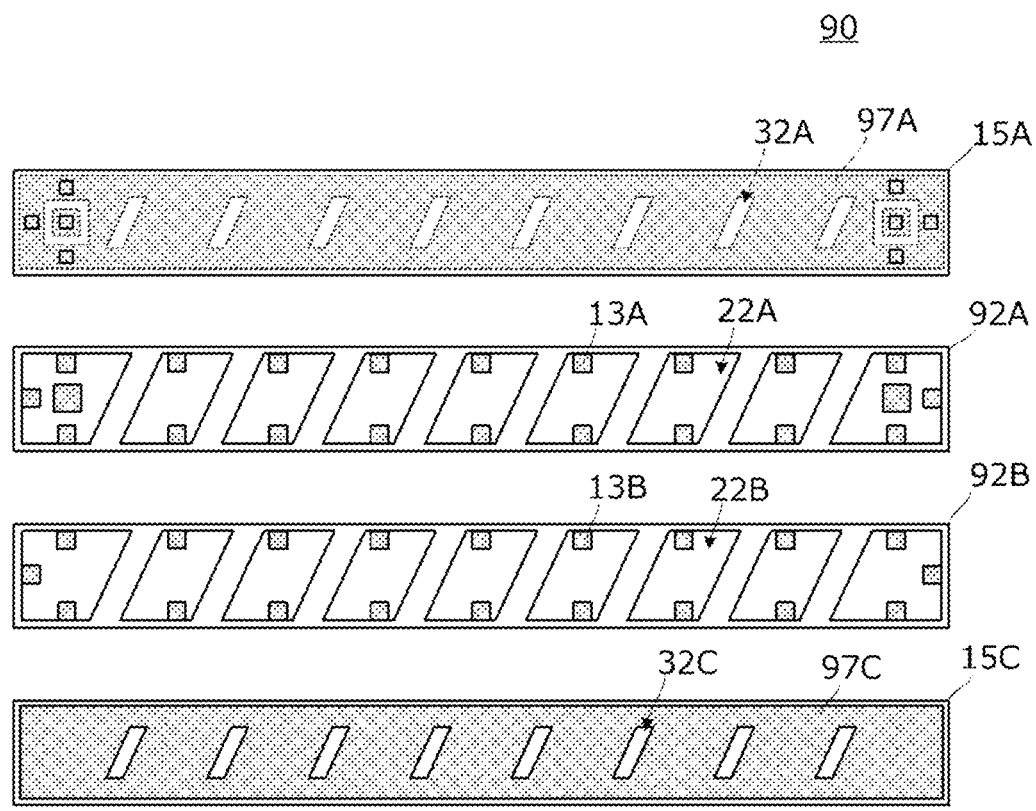
FIG. 7 is an exploded plan view illustrating some layers of a transmission line according to a Fourth Preferred Embodiment of the present invention.

FIG. 7 is an exploded plan view illustrating some layers of a transmission line 90 according to the Fourth Preferred Embodiment of the present invention. The transmission line 90 differs from the transmission line 10 according to the First Preferred Embodiment (refer to FIG. 2) as follows. The transmission line 90 includes insulating substrate 92A and 92B and ground conductors 97A and 97C instead of the insulating substrates 12A and 12B and the ground conductors 17A and 17C. In FIG. 7, illustration of layers of the structure 11B is omitted.

Openings 22A in the insulating substrate 92A and openings 22B in the insulating substrate 92B are shaped like parallelograms and extend diagonally with respect to the extension direction of the signal line 16 (not shown in FIG. 7). As a result, the hollow portions of the transmission line 90 also extend diagonally with respect to the extension direction of the signal line 16. Similarly, openings 32A in the ground conductor 97A and openings 32C in the ground conductor 97C are also shaped like parallelograms and also extend diagonally with respect to the extension direction of the signal line 16.

In the Fourth Preferred Embodiment, the boundaries between regions in which hollow portions are provided and regions in which hollow portions are not provided are inclined with respect to the extension direction of the signal line 16. Therefore, moving along the transmission line 90 in the extension direction of the signal line 16, there is a gradual transition from a region in which a hollow portion is provided to a region in which a hollow portion is not provided and from a region in which a hollow portion is not provided to a region in which a hollow portion is provided. As a result, the characteristic impedance of the transmission line 90 smoothly changes along the extension direction of the signal line 16.

Fifth Preferred Embodiment

In a Fifth Preferred Embodiment, openings in a ground conductor are larger in a bent portion of the transmission line than in the rest of the transmission line.

Figure 8:
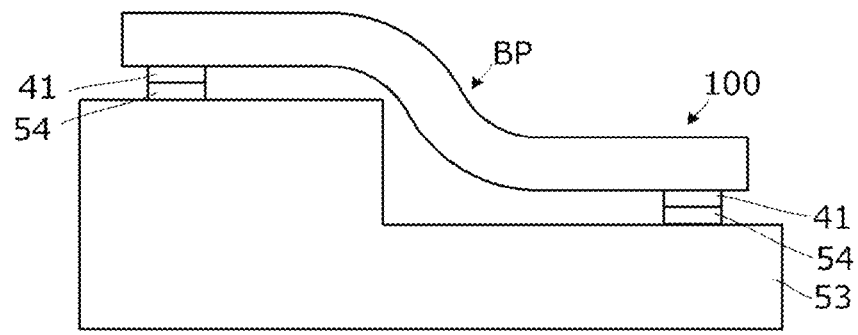
FIG. 8 is a conceptual side view of a transmission line according to a Fifth Preferred Embodiment of the present invention.

FIG. 8 is a conceptual side view of a transmission line 100 according to the Fifth Preferred Embodiment of the present invention. The transmission line 100 includes a bent portion BP. The transmission line 100 is, for example, mounted on a circuit board 53 including a step portion. Connectors 41 of the transmission line 100 are connected to connectors 54 of the circuit board 53.

Figure 9:
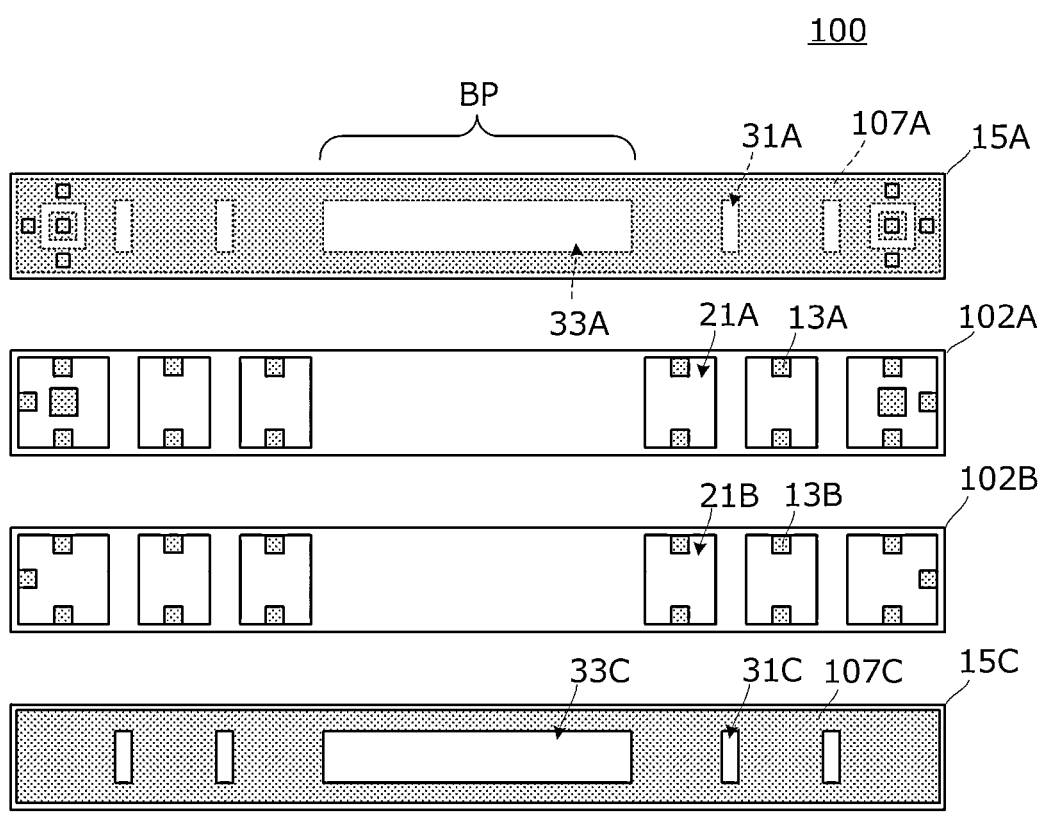
FIG. 9 is an exploded plan view illustrating some layers of the transmission line.

FIG. 9 is an exploded plan view illustrating some layers of the transmission line 100. The transmission line 100 differs from the transmission line 10 according to the First Preferred Embodiment (refer to FIG. 2) as follows. The transmission line 100 includes insulating substrates 102A and 102B and ground conductors 107A and 107C instead of the insulating substrates 12A and 12B and the ground conductors 17A and 17C. In FIG. 9, illustration of layers of the structure 11B is omitted.

The ground conductors 107A and 107C respectively have openings 33A and 33C in the bent portion BP. The opening 33A in the ground conductor 107A and the opening 33C in the ground conductor 107C extend across substantially the entirety of the bent portion BP when looking in plan view in the bonding direction. The opening 33A of the ground conductor 107A and the opening 33C of the ground conductor 107C are larger than the openings 31A of the ground conductor 107A and the openings 31C of the ground conductor 107C disposed in portions that are not the bent portion BP. The insulating substrates 102A and 102B do not have openings in the bent portion BP. As a result, no hollow portions are provided in the bent portion BP.

A plurality of openings may be provided in the bent portion BP in the ground conductors 107A and 107C and the openings in the bent portion BP may be larger than those in the other portions of the ground conductors 107A and 107C.

Furthermore, one or more hollow portions may be provided in the bent portion BP and the hollow portions in the bent portion BP may be smaller than those in the other portions.

In the Fifth Preferred Embodiment, since the opening 33A in the ground conductor 107A and the opening 33C in the ground conductor 107C are larger than the openings 31A in the ground conductor 107A and the openings 31C in the ground conductor 107C, the transmission line 100 is easily bent at the bent portion BP. The configuration of the Fifth Preferred Embodiment is useful when the transmission line 100 is thick and therefore difficult to bend.

Furthermore, since no hollow portions are provided in the bent portion BP, deformation of hollow portions caused by a bending process is prevented.

Sixth Preferred Embodiment

In a Sixth Preferred Embodiment, the ground conductors do not have any openings in a bent portion of the transmission line.

Figure 10:
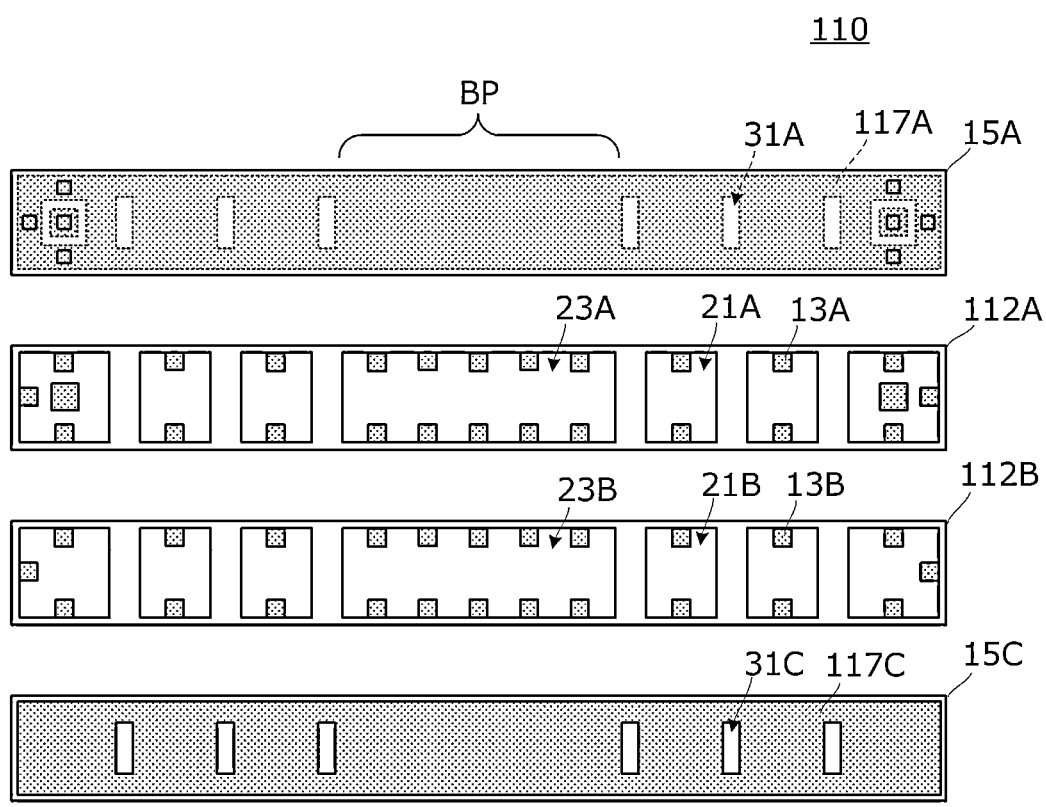
FIG. 10 is an exploded plan view illustrating some layers of a transmission line according to a Sixth Preferred Embodiment of the present invention.

FIG. 10 is an exploded plan view illustrating some layers of a transmission line 110 according to the Sixth Preferred Embodiment of the present invention. The transmission line 110 differs from the transmission line 100 according to the Fifth Preferred Embodiment (refer to FIG. 9) as follows. The transmission line 110 includes insulating substrates 112A and 112B and ground conductors 117A and 117C instead of the insulating substrates 102A and 102B and the ground conductors 107A and 107C according to the Fifth Preferred Embodiment. In FIG. 10, illustration of layers of the structure 11B is omitted.

The ground conductors 117A and 117C do not have openings in the bent portion BP. The insulating substrates 112A and 112B respectively have openings 23A and 23B in the bent portion BP. The opening 23A in the insulating substrate 112A and the opening 23B in the insulating substrate 112B are disposed over substantially the entirety of the bent portion BP when seen in plan view in the bonding direction and are larger than the openings 21A of the insulating substrate 112A and the openings 21B of the insulating substrate 112B disposed in portions other than the bent portion BP. As a result, the hollow portions of the transmission line 110 extend across substantially the entire bent portion BP when looking in plan view in the bonding direction, and the hollow portions in the bent portion BP are larger than those in the other portions.

One or more openings may be provided in the bent portion BP in the ground conductors 117A and 117C and the openings in the bent portion BP may be smaller than those in the other portions of the ground conductors 117A and 117C. Furthermore, a plurality of hollow portions may be provided in the bent portion BP and the hollow portions in the bent portion BP may be larger than those in the other portions.

In the Sixth Preferred Embodiment, in contrast to the Fifth Preferred Embodiment, the ground conductors 117A and 117C are not removed from the bent portion BP. Therefore, the bent shape of the transmission line 110 is maintained due to the ground conductors 117A and 117C being bent through plastic deformation in the bent portion BP.

If a thermoplastic resin is used as the material of the insulating substrates 15A, 15B (not shown in FIG. 10), and 15C of the transmission line 110, the bent shape of the transmission line 110 can also be maintained by the plastic deformation of the insulating substrates 15A, 15B, and 15C. In addition, the bent shape of the transmission line 110 can also be maintained by the plastic deformation of the metal bonding materials 13A and 13B.

Seventh Preferred Embodiment

In a Seventh Preferred Embodiment, when looking in plan view in the bonding direction, hollow portions that are above the signal conductor and hollow portions that are below the signal conductor are disposed at positions that are shifted with respect to each other in the extension direction of the signal line.

Figure 11:
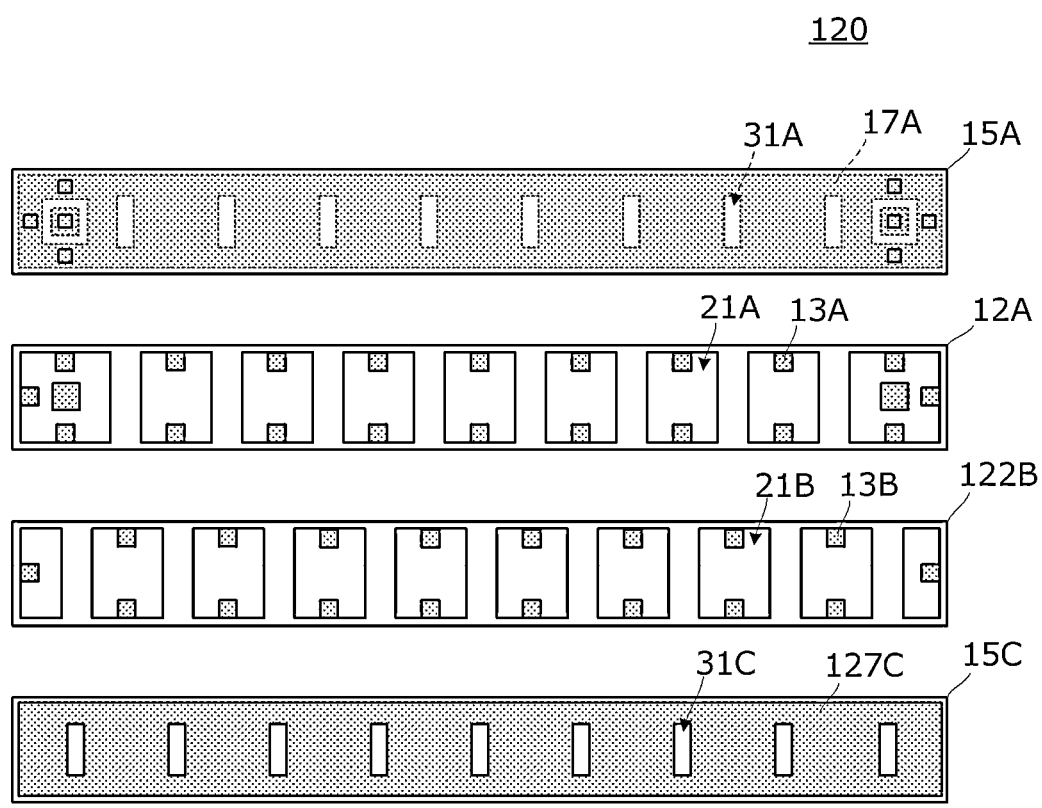
FIG. 11 is an exploded plan view illustrating some layers of a transmission line according to a Seventh Preferred Embodiment of the present invention.

FIG. 11 is an exploded plan view illustrating some layers of a transmission line 120 according to the Seventh Preferred Embodiment of the present invention. The transmission line 120 differs from the transmission line 10 according to the First Preferred Embodiment (refer to FIG. 2 and FIG. 3A) as follows. The transmission line 120 includes an insulating substrate 122B and a ground conductor 127C instead of the insulating substrate 12B and the ground conductor 17C. In FIG. 11, illustration of layers of the structure 11B is omitted.

Openings 21B in the insulating substrate 122B are disposed at positions that are shifted from those of openings 21A in the insulating substrate 12A in the extension direction of the signal line 16. As a result, hollow portions 14B (shown in FIG. 11), which are below the signal line 16, are disposed at positions shifted from those of hollow portions 14A (shown in FIG. 11), which are above the signal line 16, in the extension direction of the signal line 16. Similarly, openings 31C in the ground conductor 127C are disposed at positions shifted from those of openings 31A in the ground conductor 17A in the extension direction of the signal line 16.

In the Seventh Preferred Embodiment, regions in which the hollow portions 14A are provided and regions in which the hollow portions 14B (shown in FIG. 11) are not provided overlap when looking in plan view in the bonding direction. Therefore, changes in the characteristic impedance that occur when moving along the transmission line 120 in the extension direction of the signal line 16 are further reduced.

Eighth Preferred Embodiment

In an Eighth Preferred Embodiment, the metal bonding materials spread out and fill the openings of the insulating substrates in the extension direction of the signal line.

Figure 12:
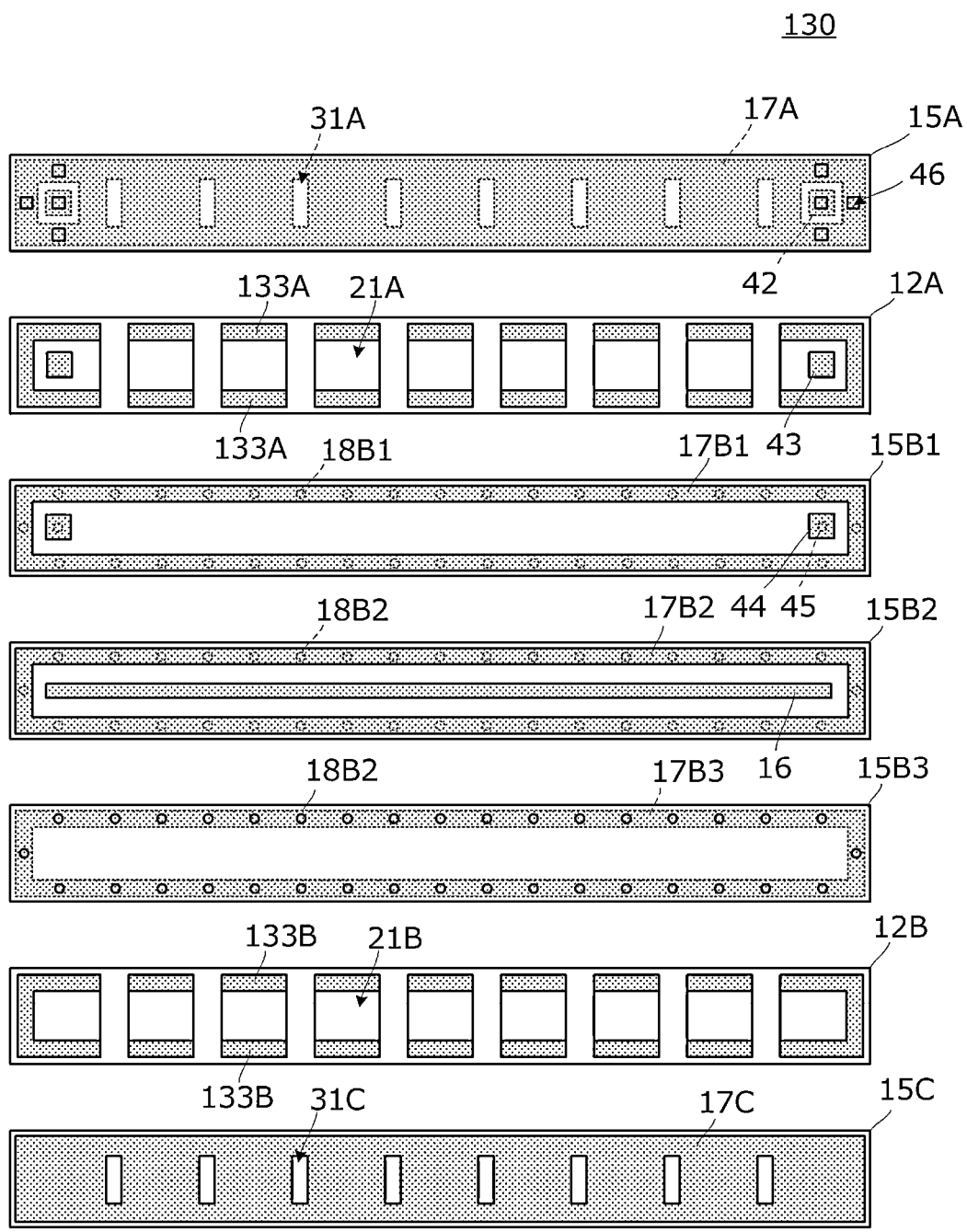
FIG. 12 is an exploded plan view illustrating the layers of a transmission line according to an Eighth Preferred Embodiment of the present invention.

FIG. 12 is an exploded plan view illustrating the layers of a transmission line 130 according to the Eighth Preferred Embodiment of the present invention. The transmission line 130 differs from the transmission line 10 according to the First Preferred Embodiment (refer to FIG. 2) as follows. The transmission line 130 includes metal bonding materials 133A and 133B instead of the metal bonding materials 13A and 13B (refer to FIG. 3A). The metal bonding materials 133A are disposed in the openings 21A of the insulating substrate 12A and have the same width as the openings 21A in the insulating substrate 12A in the extension direction of the signal line 16. Similarly, the metal bonding materials 133B are disposed in the openings 21B in the insulating substrate 12B and have the same width as the openings 21B in the insulating substrate 12B in the extension direction of the signal line 16. The metal bonding materials 133A and 133B may have rectangular or substantially rectangular shapes, which are longer in the extension direction of the signal line 16, in a main portion of the transmission line 130 (a portion connected between mounting electrode portions of the transmission line 130) and extend along the edges of the transmission line 130 in the mounting electrode portions of the transmission line 130.

In the Eighth Preferred Embodiment, the metal bonding materials 133A spread out and fill the openings 21A in the insulating substrate 12A in the extension direction of the signal line 16. Similarly, the metal bonding materials 133B spread out and fill the openings 21B in the insulating substrate 12B in the extension direction of the signal line 16. Therefore, the insulating substrates 12A and 12B are unlikely to be displaced relative to each other in the extension direction of the signal line 16 during a heat pressing process. As a result, a situation where the insulating substrates 12A and 12B, i.e., the spacers, are out of alignment with each other in the extension direction of the signal line 16 is reduced or prevented.

The metal bonding materials 133A are provided at both ends of the openings 21A in the width direction of the transmission line 130. Similarly, the metal bonding materials 133B are provided at both ends of the openings 21B in the width direction of the transmission line 130. Therefore, a situation where the insulating substrates 12A and 12B, i.e., the spacers, are out of alignment with each other in the width direction of the transmission line 130 is also reduced or prevented.

Ninth Preferred Embodiment

In a Ninth Preferred Embodiment, in contrast to the Second Preferred Embodiment, openings are provided in a ground conductor of an outermost layer.

Figure 13A:
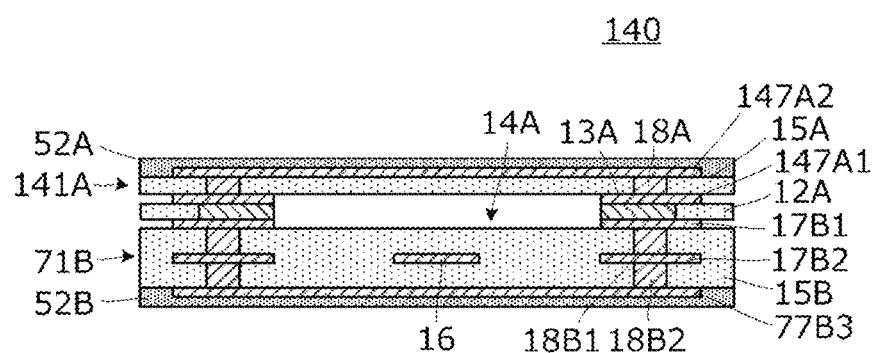
FIGS. 13A and 13B are sectional views of a transmission line according to a Ninth Preferred Embodiment of the present invention.
Figure 13B:
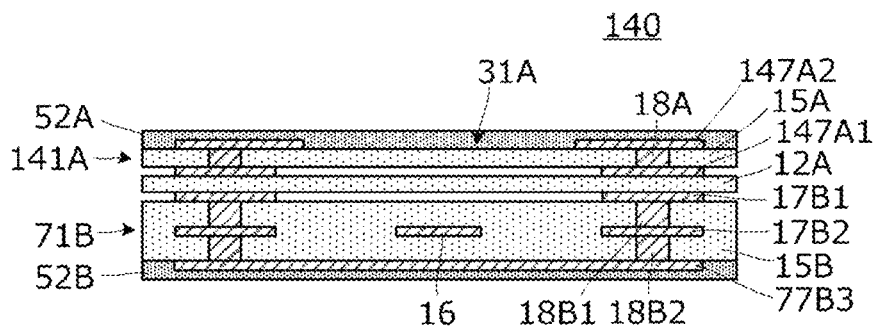

FIGS. 13A and 13B are sectional views of a transmission line 140 according to the Ninth Preferred Embodiment of the present invention. FIGS. 13A and 13B respectively correspond to the A-A sectional view and the B-B sectional view of the transmission line 10 according to the First Preferred Embodiment (refer to FIGS. 3A and 3B).

The transmission line 140 differs from the transmission line 70 according to the Second Preferred Embodiment (refer to FIGS. 5A and 5B) as follows. The transmission line 140 includes a structure 141A including ground conductors 147A1 and 147A2 instead of the structure 71A including the ground conductor 17A and the auxiliary ground conductor 51 (refer to FIGS. 5A, 5B, 6A and 6B). The ground conductor 147A1 has the same shape as the ground conductor 17B1 (refer to FIG. 2), is disposed on the lower surface of the insulating substrate 15A, and extends in the length direction of the structure 141A along both edges in the width direction of the structure 141A. The ground conductor 147A2 is located in the outermost layer among the ground conductors of the transmission line 140 and includes openings 31A. Specifically, the ground conductor 147A2 has the same shape or substantially the same shape as the ground conductor 17A (refer to FIG. 2) and is positioned on the upper surface of the insulating substrate 15A so that the openings 31A do not overlap the hollow portions 14A.

In the Ninth Preferred Embodiment, the area across which the signal line 16 and the ground conductors face each other is adjusted by changing only the openings 31A in the ground conductor 147A2 in the outermost layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a first structure including a first insulating substrate and a first ground conductor on or in the first insulating substrate;
a second structure including a second insulating substrate and a signal line, and an interlayer connection conductor on or in the second insulating substrate; and
a spacer including a third insulating substrate including an opening; wherein
the first insulating substrate and the second insulating substrate are stacked with the third insulating substrate interposed therebetween to define at least one hollow portion;
the signal line and the first ground conductor partially face each other across the at least one hollow portion in a bonding direction;
the first ground conductor includes at least one opening in a region that overlaps the signal line but does not overlap the at least one hollow portion when looking in plan view in the bonding direction; and
the second structure includes a second ground conductor.

2. The transmission line according to claim 1, wherein
the at least one hollow portion includes a plurality of hollow portions and the at least one opening includes a plurality of the openings provided in the first ground conductor;
the plurality of hollow portions are periodically disposed along an extension direction of the signal line; and
the plurality of openings in the first ground conductor are also periodically disposed along the extension direction of the signal line.

3. The transmission line according to claim 1, wherein an auxiliary ground conductor is provided at a surface layer side of the transmission line so as to cover the opening in the first ground conductor.

4. The transmission line according to claim 1, wherein the signal line and the first ground conductor face each other across the at least one hollow portion and the second insulating substrate.

5. The transmission line according to claim 1, wherein the transmission line includes a portion where a thickness of the second insulating substrate is smaller at a position where the signal line faces the first ground conductor.

6. The transmission line according to claim 1, wherein the at least one hollow portion and the at least one opening in the first ground conductor extend diagonally with respect to an extension direction of the signal line.

7. The transmission line according to claim 1, wherein
the transmission line includes a bent portion;
the at least one opening includes a plurality of openings provided in the first ground conductor; and
among the plurality of openings in the first ground conductor, openings in the bent portion are larger than openings in other portions.

8. The transmission line according to claim 1, wherein
the transmission line includes a bent portion; and
the first ground conductor does not have an opening in the bent portion.

9. The transmission line according to claim 1, further comprising a metal bonding material that bonds the first structure and the second structure to each other with the spacer interposed therebetween.

10. An electronic device comprising:
a circuit board; and
a transmission line connected to the circuit board; wherein the transmission line includes:
- a first structure including a first insulating substrate and a first ground conductor on or in the first insulating substrate;
- a second structure including a second insulating substrate and a signal line, a second ground conductor, and an interlayer connection conductor on or in the second insulating substrate;
- a spacer including a third insulating substrate including an opening; and
- a metal bonding material that bonds the first structure and the second structure to each other with the spacer interposed therebetween;

the first insulating substrate and the second insulating substrate are stacked with the third insulating substrate interposed therebetween to provide at least one hollow portion;

the signal line and the first ground conductor partially face each other across the at least one hollow portion in a bonding direction; and the first ground conductor includes at least one opening in a region that overlaps the signal line but does not overlap the at least one hollow portion when looking in plan view in the bonding direction.

11. The electronic device according to claim 10, wherein
the at least one hollow portion includes a plurality of hollow portions and the at least one opening includes a plurality of openings provided in the first ground conductor;
the plurality of hollow portions are periodically disposed along an extension direction of the signal line; and
the plurality of openings in the first ground conductor are also periodically disposed along the extension direction of the signal line.

12. The electronic device according to claim 11, wherein the plurality of the hollow portions are provided in a first portion of the transmission line and not in a second portion of the transmission line.

13. The electronic device according to claim 12, wherein the plurality of openings in the first ground conductor are located in the second region portion of the transmission line.

14. The electronic device according to claim 10, wherein the signal line and the first ground conductor face each other across the at least one hollow portion and the second insulating substrate.

15. The electronic device according to claim 10, wherein the transmission line includes a portion where a thickness of the second insulating substrate is smaller at a position where the signal line faces the first ground conductor.

16. The electronic device according to claim 10, wherein the at least one hollow portion and the at least one opening in the first ground conductor extend diagonally with respect to an extension direction of the signal line.

17. The electronic device according to claim 10, wherein
the transmission line includes a bent portion;
the at least one opening includes a plurality of openings provided in the first ground conductor; and
among the plurality of openings in the first ground conductor, openings in the bent portion are larger than openings in other portions.

18. The electronic device according to claim 10, wherein
the transmission line includes a bent portion; and
the first ground conductor does not have an opening in the bent portion.

19. The electronic device according to claim 10, wherein an auxiliary ground conductor is provided at a surface layer side of the transmission line so as to cover the at least one opening in the first ground conductor.

* * * * *